US012237320B2

(12) United States Patent
Lin et al.

(10) Patent No.: US 12,237,320 B2
(45) Date of Patent: Feb. 25, 2025

(54) PACKAGE STRUCTURE AND METHOD OF FORMING THE SAME

(71) Applicant: Taiwan Semiconductor Manufacturing Company, Ltd., Hsinchu (TW)

(72) Inventors: Wei-Hung Lin, Hsinchu County (TW); Hui-Min Huang, Taoyuan (TW); Chang-Jung Hsueh, Taipei (TW); Wan-Yu Chiang, Hsinchu (TW); Ming-Da Cheng, Taoyuan (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/515,274

(22) Filed: Nov. 21, 2023

(65) Prior Publication Data

US 2024/0088119 A1    Mar. 14, 2024

Related U.S. Application Data

(63) Continuation of application No. 17/460,347, filed on Aug. 30, 2021, now Pat. No. 11,855,058.

(51) Int. Cl.
| | |
|---|---|
| *H01L 25/18* | (2023.01) |
| *H01L 21/78* | (2006.01) |
| *H01L 23/00* | (2006.01) |
| *H01L 23/31* | (2006.01) |
| *H01L 23/498* | (2006.01) |

(52) U.S. Cl.
CPC .............. *H01L 25/18* (2013.01); *H01L 21/78* (2013.01); *H01L 23/3107* (2013.01); *H01L 23/49838* (2013.01); *H01L 24/96* (2013.01)

(58) Field of Classification Search
CPC ..... H01L 25/18; H01L 21/78; H01L 23/3107; H01L 23/49838; H01L 24/96; H01L 23/3171; H01L 25/0655; H01L 2221/68381; H01L 2224/04105; H01L 2224/16227; H01L 2924/18162; H01L 21/561; H01L 23/3128; H01L 21/568; H01L 2221/68327; H01L 2221/68345; H01L 2924/1815; H01L 21/6836; H01L 21/6835; H01L 2224/18; H01L 23/49811
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — Thanh T Nguyen
(74) *Attorney, Agent, or Firm* — JCIPRNET

(57) ABSTRACT

Provided are a package structure and a method of forming the same. The method includes providing a first package having a plurality of first dies and a plurality of second dies therein; performing a first sawing process to cut the first package into a plurality of second packages, wherein one of the plurality of second packages comprises three first dies and one second die; and performing a second sawing process to remove the second die of the one of the plurality of second packages, so that a cut second package is formed into a polygonal structure with the number of nodes greater than or equal to 5.

16 Claims, 16 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2015/0235977 A1* | 8/2015 | Shao ................. H01L 24/10 |
| | | 257/737 |
| 2020/0105641 A1* | 4/2020 | Lai .................. H01L 21/568 |
| 2020/0258843 A1* | 8/2020 | Zhang ................ H01L 21/78 |
| 2021/0183844 A1* | 6/2021 | Cheng ................ H01L 24/19 |

\* cited by examiner

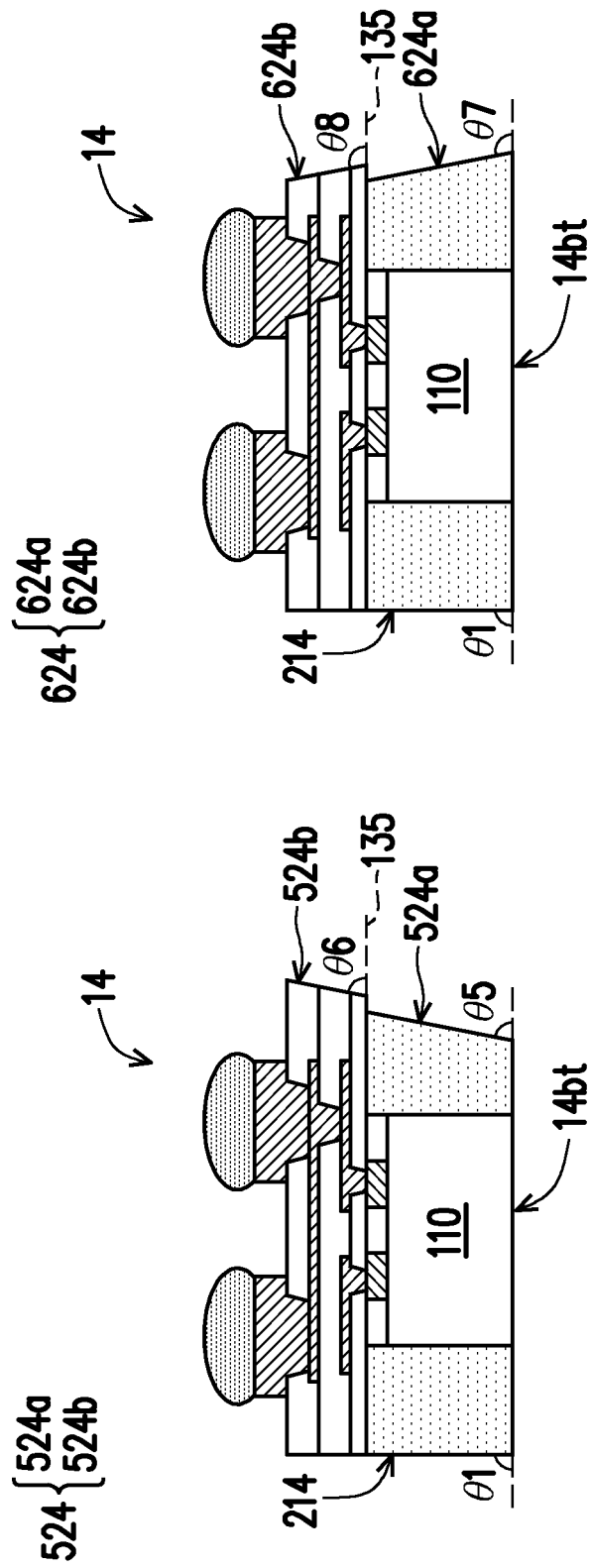

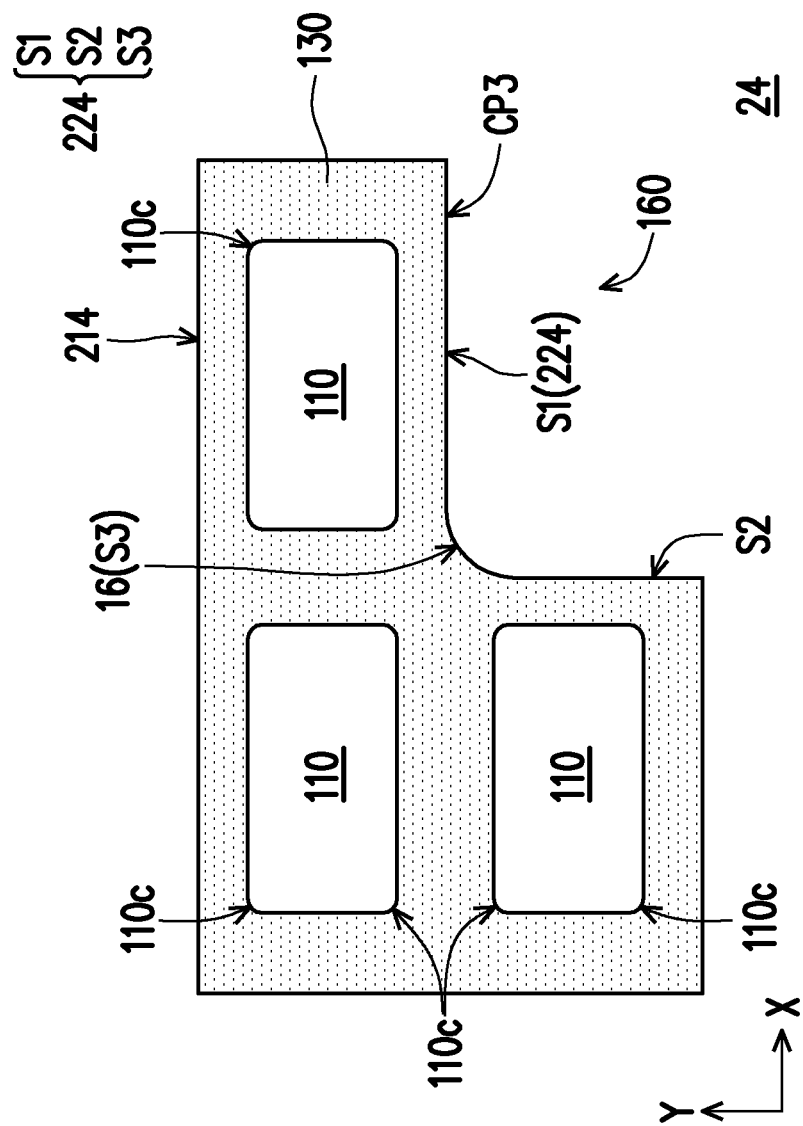

PACKAGE STRUCTURE AND METHOD OF FORMING THE SAME

CROSS-REFERENCE TO RELATED APPLICATION

This is a continuation application of and claims the priority benefit of U.S. application Ser. No. 17/460,347, filed on Aug. 30, 2021, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 7A are cross-sectional views of a method of forming a package structure in accordance with some embodiments.

FIG. 5B to FIG. 7B are top views of FIG. 5A to FIG. 7A, respectively.

FIG. 9A to FIG. 9E are cross-sectional views along a line I-I of FIG. 8 in accordance with various embodiments.

FIG. 11 is a top view of a package structure in accordance with some alternative embodiments.

DETAILED DESCRIPTION

Figure 1:
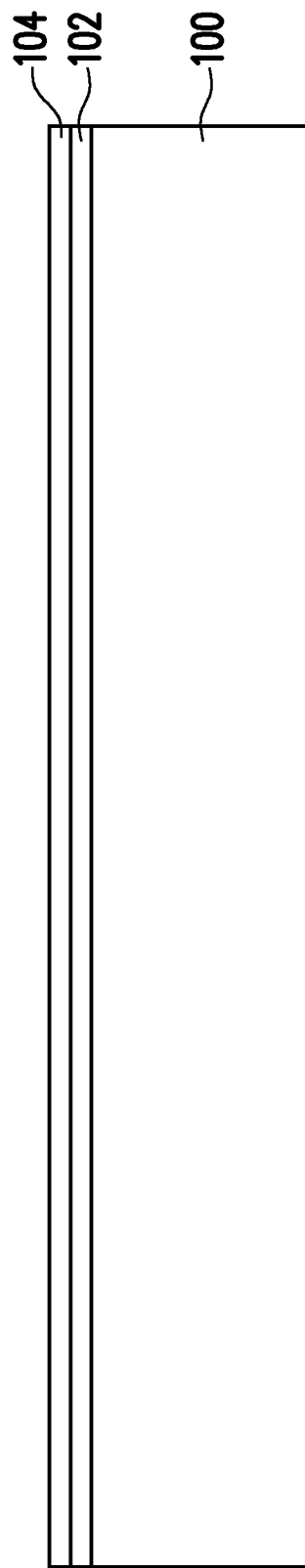
FIG. 1 to FIG. 4 are cross-sectional views of a method of forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 4 are cross-sectional views of a method of forming a package structure in accordance with some embodiments. FIG. 5A to FIG. 7A are cross-sectional views of a method of forming a package structure in accordance with some embodiments. FIG. 5B to FIG. 7B are top views of FIG. 5A to FIG. 7A, respectively. FIG. 8 is a top view of a package structure in accordance with some embodiments.

Referring to FIG. 1, a carrier 100 is provided. In some embodiments, the carrier 100 may be made of a material such as silicon, polymer, polymer composite, metal foil, ceramic, glass, glass epoxy, beryllium oxide, tape, or other suitable material for structural support. In the embodiment, the carrier 100 is a glass substrate.

A de-bonding layer 102 is deposited or laminated on the carrier 100. In some embodiments, the de-bonding layer 102, which may function as a release layer to facilitate a subsequent carrier de-bonding process, is formed over the carrier 100. The de-bonding layer 102 may be photosensitive and may be easily detached from the carrier 100 by, e.g., shining an ultra-violet (UV) light on the carrier 100 in the subsequent carrier de-bonding process. For example, the de-bonding layer 102 may be a light-to-heat-conversion (LTHC) film made by 3M Company of St. Paul, Minnesota. In some alternative embodiments, the de-bonding layer 102 is omitted.

An adhesive layer 104 is formed on the de-bonding layer 102, and the de-bonding layer 102 is sandwiched between the adhesive layer 104 and the carrier 100. In some embodiments, the adhesive layer 104 may be a die-attach film (DAF) or the like. A material of the DAF may include a phenolic base material or an epoxy base material.

Figure 2:
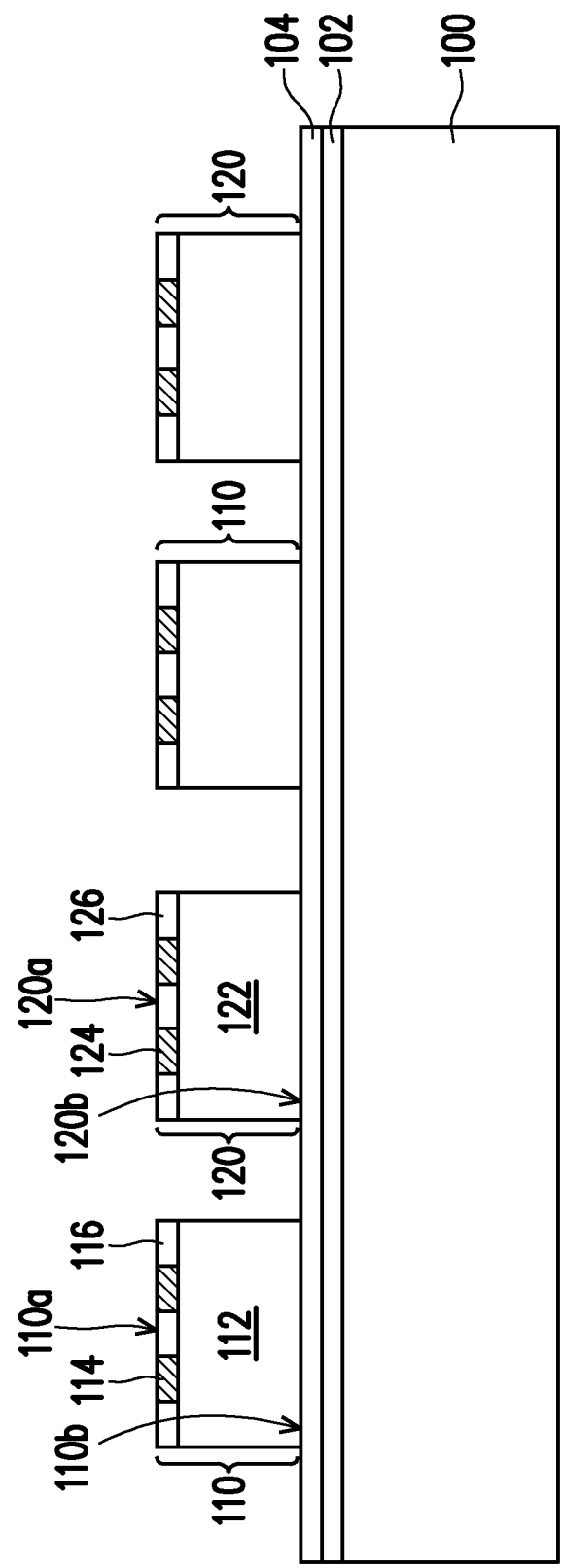

Referring to FIG. 2, a plurality of first dies 110 and a plurality of second dies 120 are picked and placed on the carrier 100. In some embodiments, the first dies 110 and the second dies 120 are attached to the carrier 100 (e.g., via the de-bonding layer 102) by the adhesive layer 104. In some embodiments, the first dies 110 are different from the second dies 120. For example, the first dies 110 are functional dies, and the second dies 120 are dummy dies (or non-functional dies). Herein, the dummy dies 120 may not include active and/or passive devices and may not provide addition electrical functionality to the package structure.

In some embodiments, the first dies 110 include system on a chips or system on chips (SoC) including several different integrated circuits, i.e. ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors include large amounts of memories, such as several gigabytes. In some alternative embodiments, the first dies 110 may be application-specific integrated circuit (ASIC) dies. In some other embodiments, the first dies 110 are logic dies.

As shown in FIG. 2, the first dies 110 may have a front side (or an active surface) 110a and a backside (or a non-active surface) 110b opposite to each other. The backside 110b of the first dies 110 is toward the carrier 100, while the front side 110a of the first dies 110 is toward upside and away from the carrier 100. Specifically, one of the first dies 110 may include a substrate 112, a plurality of contacts 114 and a passivation layer 116.

In some embodiments, the substrate 112 may be made of silicon or other semiconductor materials. For example, the substrate 112 may be a silicon substrate. Alternatively, or additionally, the substrate 112 may include other elementary semiconductor materials such as germanium. In some embodiments, the substrate 112 is made of a compound semiconductor such as silicon carbide, gallium arsenic, indium arsenide or indium phosphide. In some embodiments, the substrate 112 is made of an alloy semiconductor such as silicon germanium, silicon germanium carbide, gallium arsenic phosphide, or gallium indium phosphide. Furthermore, the substrate 112 may be a semiconductor on insulator such as silicon on insulator (SOI) or silicon on sapphire.

The contacts 114 are formed on the substrate 112 and electrically connected to the semiconductor devices (not shown) in and/or on the substrate 112. In some embodiments, the contacts 114 may include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The contacts 114 are formed by physical vapor deposition (PVD) or electroplating, for example. In some alternative embodiments, the contact 114 may include connection pads, such as aluminum pad, for example.

In addition, an interconnect structure (not shown) may be formed between the substrate 112 and the contacts 114. The interconnect structure may interconnect the semiconductor devices in and/or on the substrate 112, so as to form an integrated circuit. The interconnect structure may be formed by, for example, metallization patterns in dielectric layers. The metallization patterns include metal lines and vias formed in one or more low-k dielectric layers.

The passivation layer 116 is formed to laterally surround the contacts 114. In some embodiments, the passivation layer 116 includes silicon oxide, silicon nitride, benzocyclobutene (BCB) polymer, polyimide (PI), polybenzoxazole (PBO) or a combination thereof and is formed by a suitable process such as spin coating, CVD or the like. In an embodiment, the passivation layer 116 may be a single-layered structure, a bi-layered structure, or a multi-layered structure.

As shown in FIG. 2, the second dies 120 may have a front side (or an active surface) 120a and a backside (or a non-active surface) 120b opposite to each other. The backside 120b of the second dies 120 is toward the carrier 100, while the front side 120a of the second dies 120 is toward upside and away from the carrier 100. Specifically, one of the second dies 120 may include a substrate 122, a plurality of contacts 124 and a passivation layer 126. In some embodiments, the substrate 122 may be made of silicon or other semiconductor materials. For example, the substrate 122 may be a silicon substrate. The contacts 124 are formed on the substrate 122. The passivation layer 126 is formed to laterally surround the contacts 124. Noted that the second dies 120 may not include active and/or passive devices and may not provide addition electrical functionality to the package structure.

Figure 3:
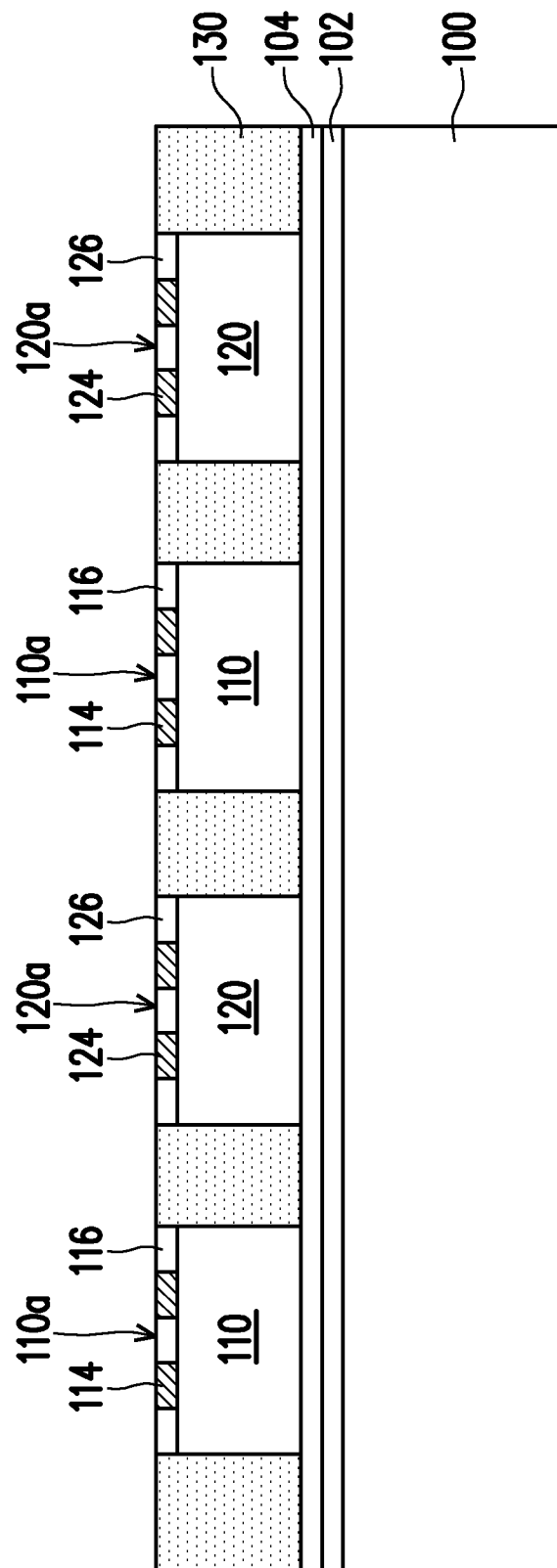

Referring to FIG. 3, an encapsulant 130 is then formed to laterally encapsulate the first dies 110 and the second dies 120. In some embodiments, the encapsulant 130 includes an epoxy, an organic polymer, a polymer with or without a silica-based or glass filler added, or other materials, as examples. In some embodiments, the encapsulant 130 includes a liquid molding compound (LMC) that is a gel type liquid when applied. The encapsulant 130 may also include a liquid or solid when applied. Alternatively, the encapsulant 130 may include other insulating and/or encapsulating materials.

In some embodiments, the encapsulant 130 is formed by using a wafer level molding process, such as a compressive molding process, a transfer molding process, or other processes. Next, a material of the encapsulant 130 is cured by using a curing process, in some embodiments. The curing process may include heating the material of the encapsulant 130 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the material of the encapsulant 130 may be cured by using other methods. In some alternative embodiments, a curing process is not included.

After the curing process, a planarization process, such as a chemical mechanical polish (CMP) process, may be performed to remove excess portions of the encapsulant 130 over the front sides 110a and 120a of the first and second dies 110 and 120. After the planarization process, the encapsulant 130, the contacts 114, 124, and the passivation layers 116, 126 have a coplanar upper surface, in some embodiments. In some alternative embodiments, the planarization process is omitted.

Figure 4:
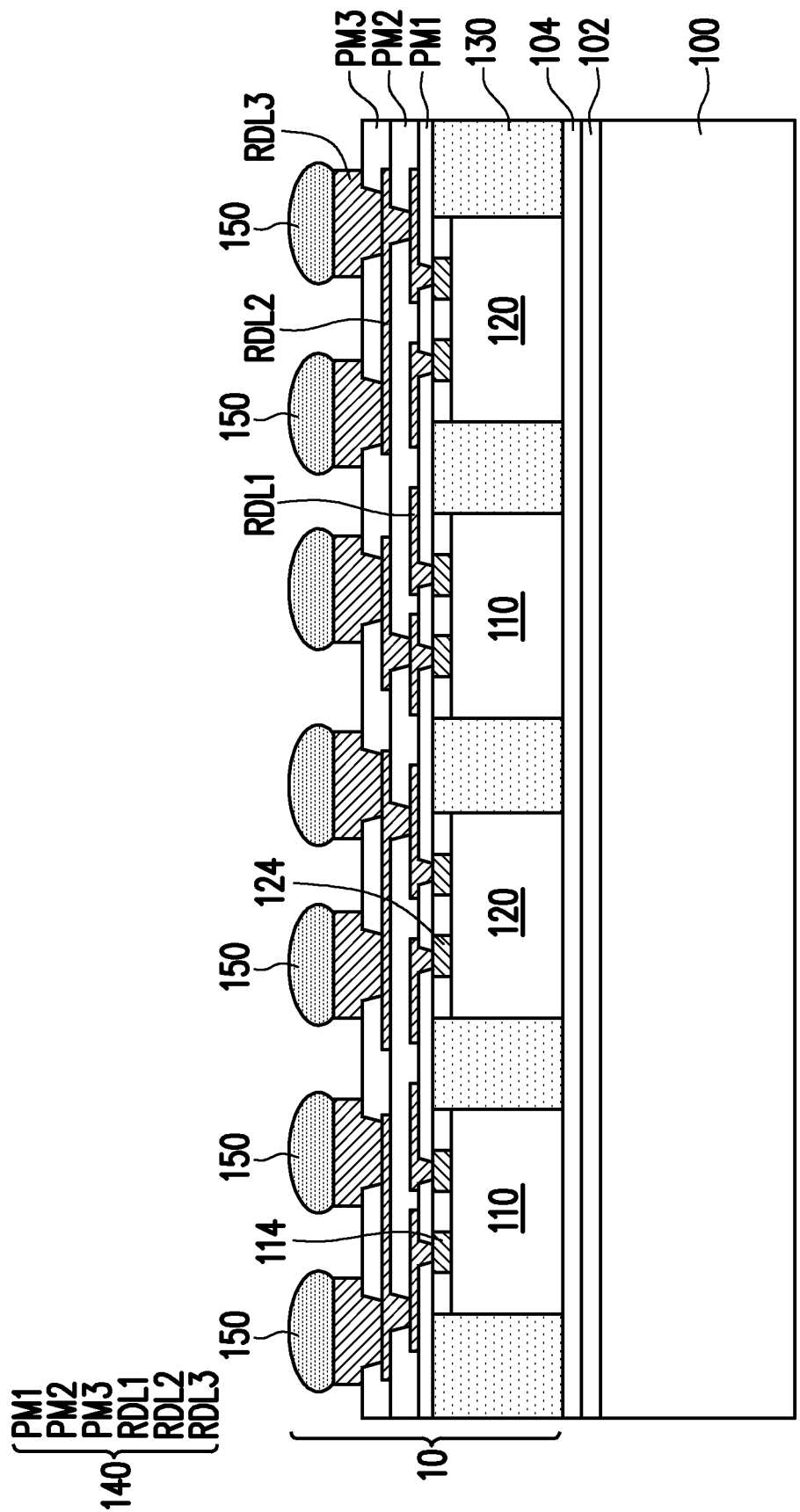

Referring to FIG. 4, a redistribution layer (RDL) structure 140 is formed on the front side 110a of the first dies 110, the front side 120*a* of the second dies 120, and the encapsulant 130. In some embodiments, the RDL structure 140 includes a plurality of polymer layers PM1, PM2, and PM3 and a plurality of redistribution layers RDL1, RDL2, and RDL3 stacked alternately. The number of the polymer layers or the redistribution layers is not limited by the disclosure.

In some embodiments, the redistribution layer RDL1 penetrates through the polymer layer PM1 to electrically connect to the contacts 114 of the first dies 114 and/or the contacts 124 of the second dies 120. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. In some embodiments, the polymer layers PM1, PM2, and PM3 include a photo-sensitive material such as polybenzoxazole (PBO), polyimide (PI), benzocyclobutene (BCB), a combination thereof or the like. In some embodiments, the redistribution layers RDL1, RDL2, and RDL3 include conductive materials. The conductive materials include metal such as copper, nickel, titanium, a combination thereof or the like, and are formed by an electroplating process. In some embodiments, the redistribution layers RDL1, RDL2, and RDL3 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, and RDL3 respectively includes a plurality of vias and a plurality of traces connected to each other. The vias penetrate through the polymer layers PM1, PM2 and PM3 and connect to the traces, and the traces are respectively located on the polymer layers PM1, PM2, and PM3, and are respectively extending on the top surfaces of the polymer layers PM1, PM2, and PM3. In some embodiments, the topmost redistribution layer RDL3 is also referred as under-ball metallurgy (UBM) layer for ball mounting.

Thereafter, a plurality of conductive terminals 150 are formed on and electrically connected to the redistribution layer RDL3 of the redistribution layer structure 140. In some embodiments, the conductive terminals 150 are made of a conductive material with low resistivity, such as Sn, Pb, Ag, Cu, Ni, Bi or an alloy thereof, and are formed by a suitable process such as evaporation, plating, ball drop, screen printing, or a ball mounting process. The conductive terminals 150 are electrically connected to the first dies 110 and the second dies 120 through the RDL structure 140 and the contacts 114 and 124.

The conductive terminals 150 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The conductive terminals 150 may include a conductive material such as solder, copper, aluminum, gold, nickel, silver, palladium, tin, the like, or a combination thereof. In some embodiments, the conductive terminals 150 comprise a eutectic material and may comprise a solder bump or a solder ball, as examples. The conductive terminals 150 may form a grid, such as a ball grid array (BGA). The conductive terminals 150 may be formed using any suitable process. Although the conductive terminals 150 are illustrated in FIG. 4 as having a partial sphere shape, the conductive terminals 150 may comprise other shapes. For example, the conductive terminals 150 may also comprise non-spherical conductive connectors.

In some embodiments, the conductive terminals 150 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 5A:
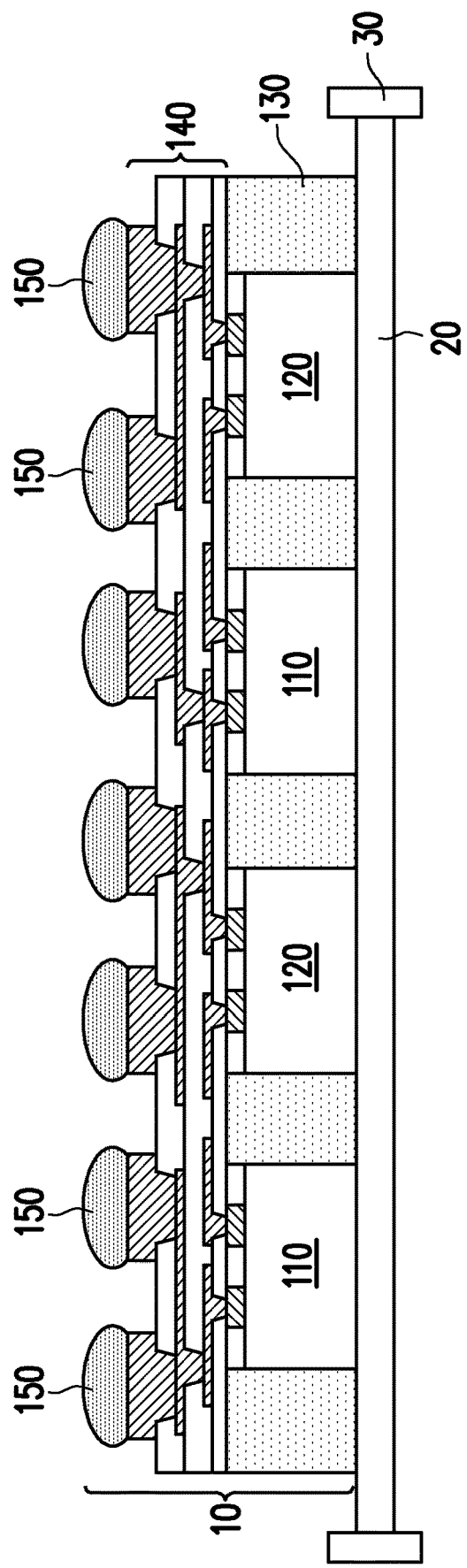

Referring to FIG. 5A, a carrier swap is then performed, so that an overlying package 10 illustrated in FIG. 4 is attached onto a tape 20 (e.g., a dicing tape) supported by a frame 30 (e.g., a metal frame). In some embodiments, the carrier swap may be formed by de-bonding the carrier 100 from the overlying package 10 via a suitable process, such as etching, grinding, or mechanical peel off. In an embodiment where the de-bonding layer 102 is an LTHC film, the carrier 100 is de-bonded by exposing the carrier 100 to a laser or UV light. The laser or UV light breaks the chemical bonds of the LTHC film that binds to the carrier 100, and the carrier 100 can then be easily detached. The de-bonding layer 102 (e.g., an LTHC film) is also removed after the carrier de-bonding process, in some embodiments. After the de-bonding the carrier 100, a cleaning process is performed to remove the adhesive layer 104 (e.g., a DAF). The cleaning process is a dry etch process, such as a plasma process, in some embodiments. In some embodiments, the cleaning process is a wet etch process. After the cleaning process, the backsides 110*b* and 120*b* of the first and second dies 110 and 120 are exposed. Next, the backsides 110*b* and 120*b* of the first and second dies 110 and 120 are attached onto the tape 20 supported by the frame 30, as shown in FIG. 5A.

Figure 5B:
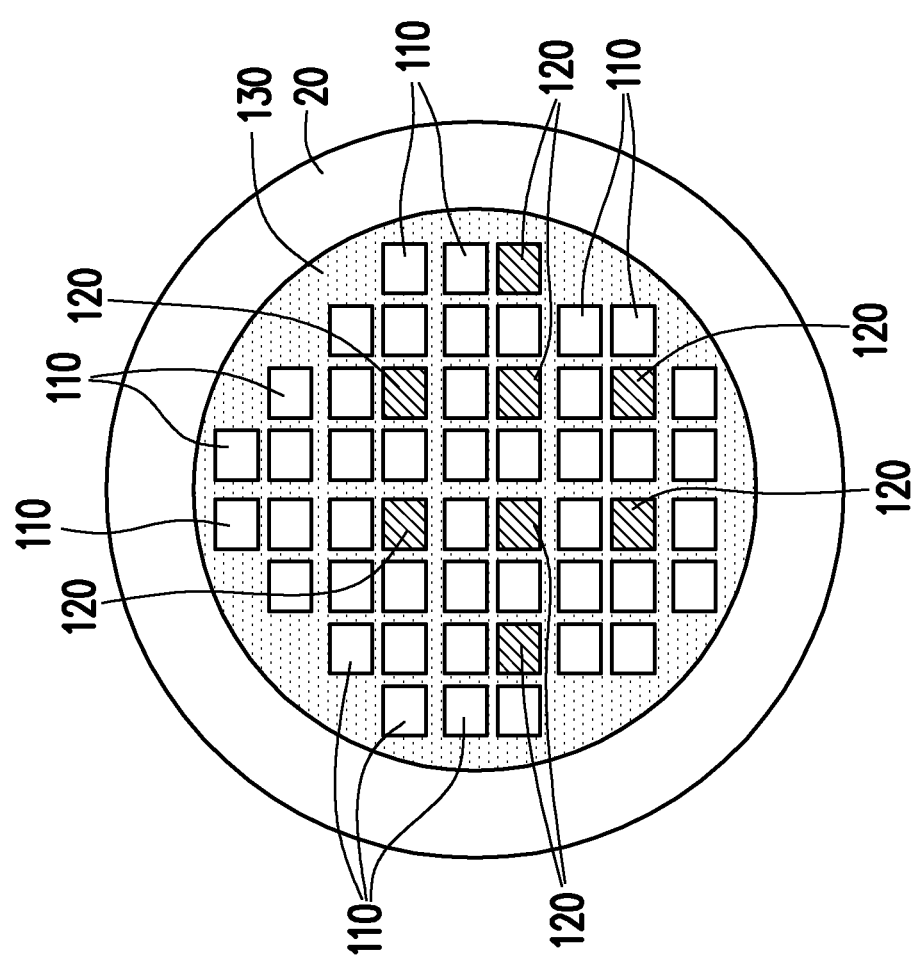

As shown in top views of FIG. 5B, the first dis 110 and the second dies 120 are disposed on the tape 20 side by side. In some embodiments, the first dis 110 and the second dies 120 are arranged in an array. However, the embodiments of the present disclosure are not limited thereto. In other embodiments, the first dis 110 and the second dies 120 are arranged in any configuration.

Figure 6A:
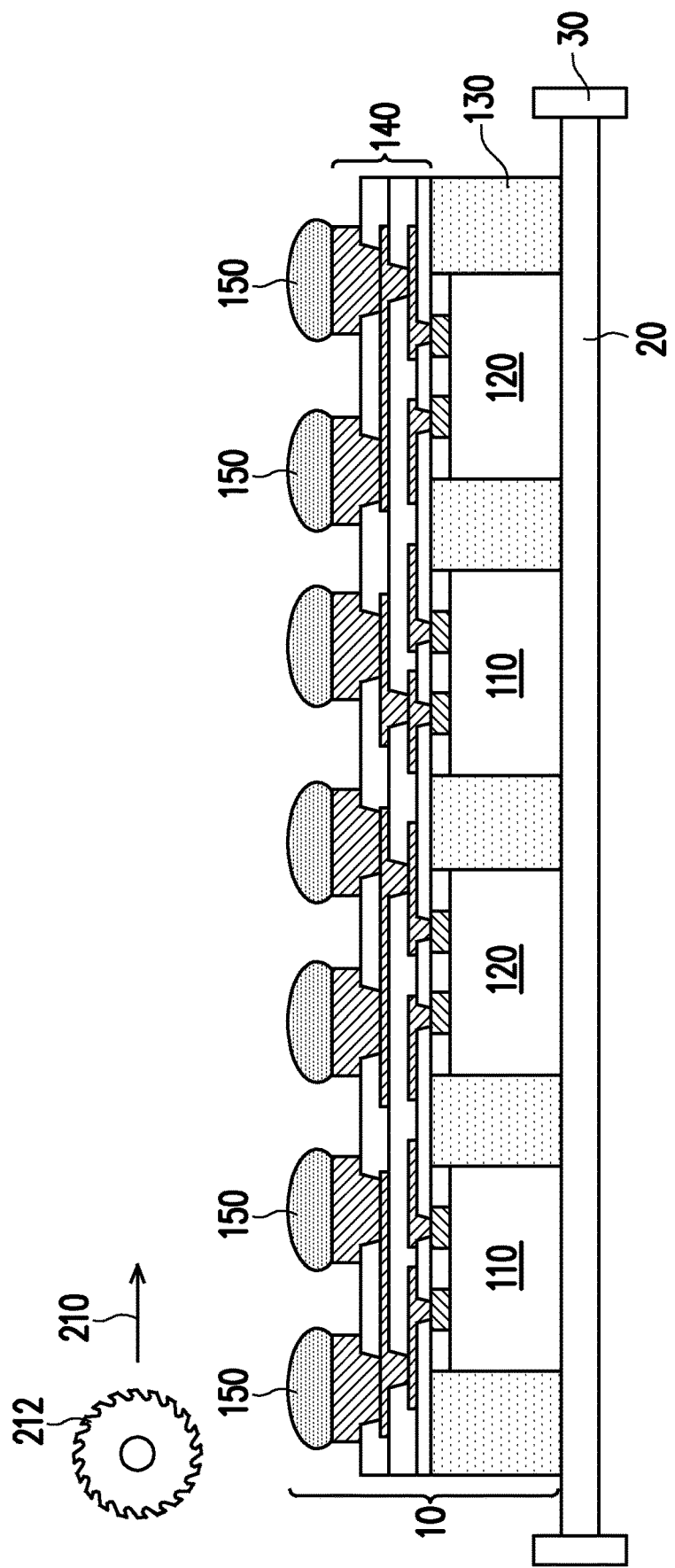
Figure 6B:
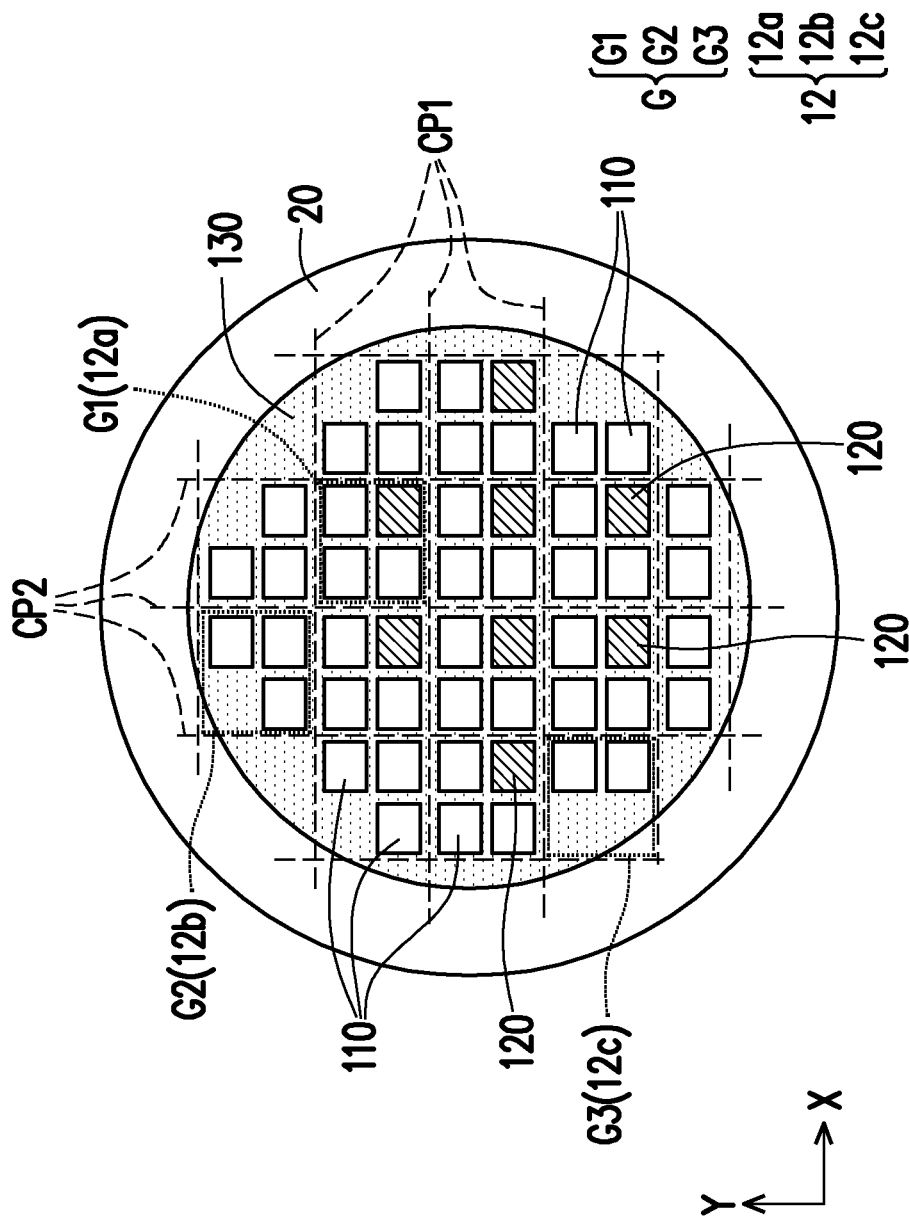

Referring to FIG. 6A and FIG. 6B, a first sawing process 210 is performed to cut the package 10 (hereinafter referred to as first package 10) into a plurality of second packages 12. In some embodiments, the first sawing process 210 includes a mechanical sawing process. The mechanical sawing process may include performing cutting along a plurality of first cutting paths CP1 and a plurality of second cutting paths CP2 by using a blade 212, as shown in FIG. 6B. In detail, the first cutting paths CP1 may are extended along a X direction and arranged alternately along a Y direction. The second cutting paths CP2 may are extended along the Y direction and arranged alternately along the X direction. In the top view of FIG. 6B, the first cutting paths CP1 and the second cutting paths CP2 may divide the first dies 110 and the second dies 120 into a plurality of groups G. The groups G may include a first group G1, a second group G2, and a third group G3. The first group G1 may include three first dies 110 and one second die 120 arranged in a 2×2 array. That is, the second package 12*a* may include three first dies 110 and one second die 120 arranged in a 2×2 array therein. The second group G2 may include three first dies 110 arranged as a L shape. That is, the second package 12*b* may include three first dies 110 arranged as the L shape therein. The third group G3 may include two first dies 110 arranged as a linear shape. That is, the second package 12*c* may include two first dies 110 arranged as the linear shape therein.

Figure 7A:
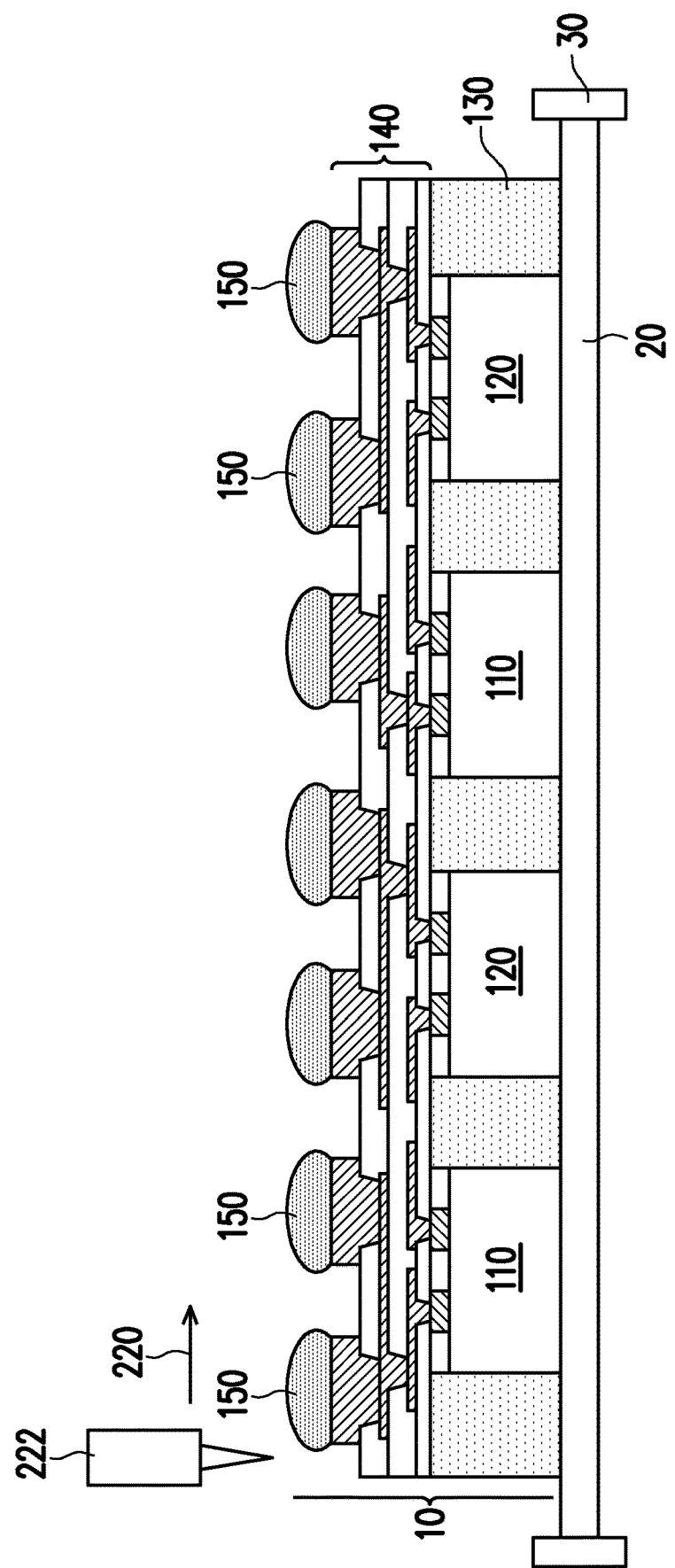
Figure 7B:
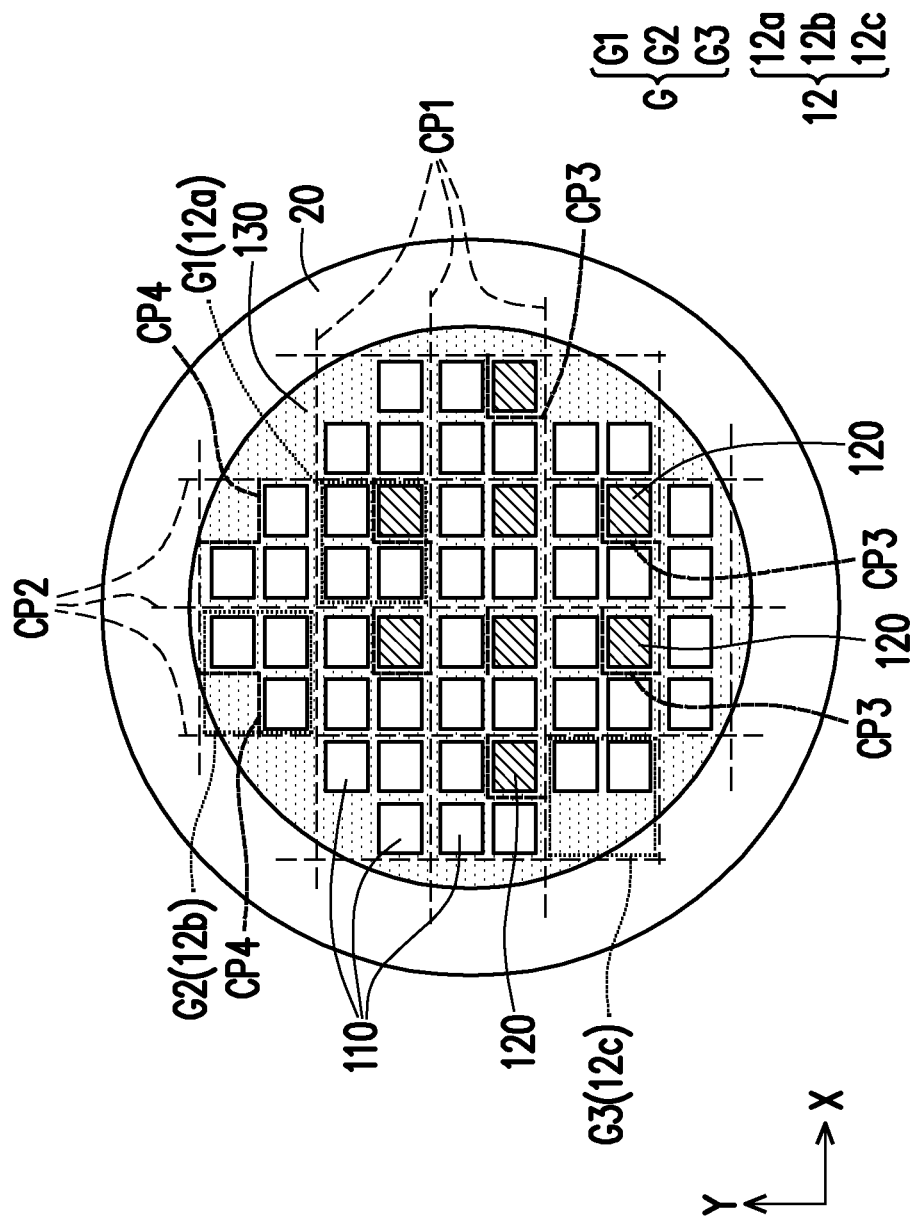
Figure 8:
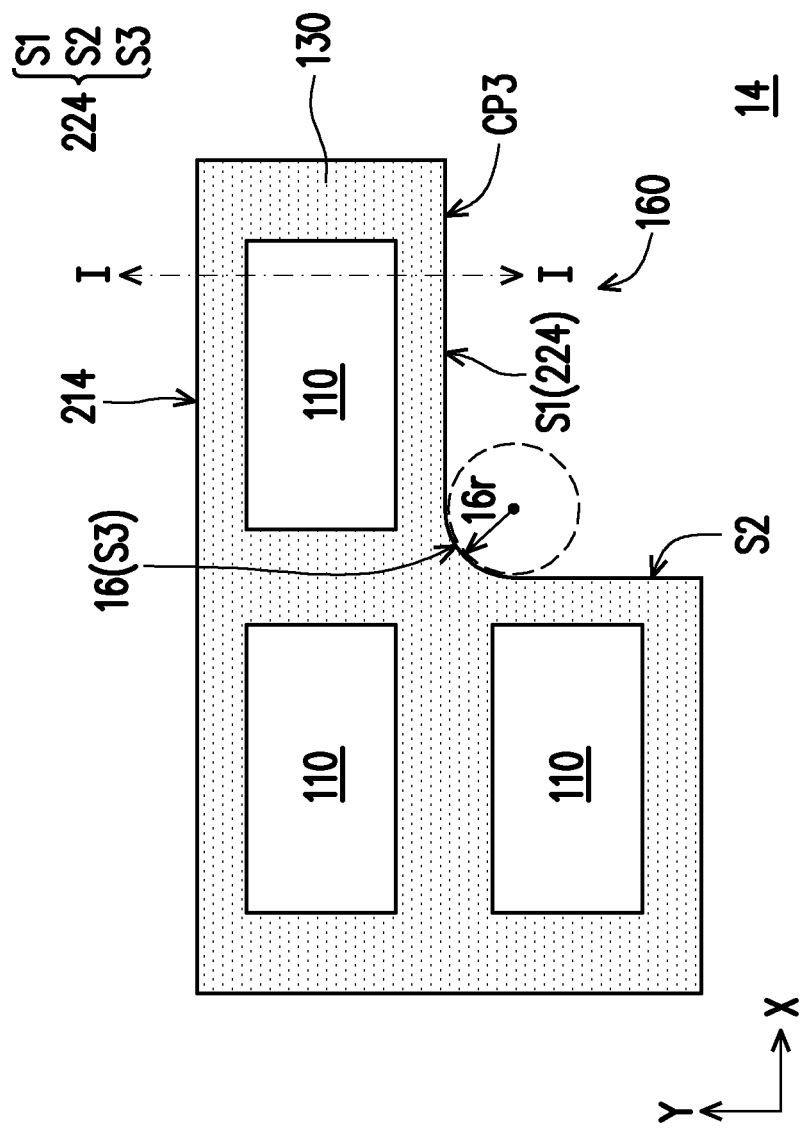
FIG. 8 is a top view of a package structure in accordance with some embodiments.

Referring to FIG. 7A and FIG. 7B, a second sawing process 220 is performed to remove the second die 120 of the second package 12a. In such embodiment, a cut second package 14 is formed into a polygonal structure with the number of nodes (or internal angles) substantially equal to 5, as shown in FIG. 8. However, the embodiments of the present disclosure are not limited thereto. In other embodiments, the number of nodes (or internal angles) of the cut second package 14 may be greater than 5 according to the needs. In some embodiments, the second sawing process 220 includes a laser cutting process. The power and the processing time of the laser cutting process may be adjusted according to different cutting materials, and the embodiment of the disclosure is not limited. In some embodiments, the laser cutting process may include performing cutting along a plurality of third cutting paths CP3 by using a laser 222. In some embodiments, the third cutting paths CP3 are not overlapped with the first cutting paths CP1 and the second cutting paths CP2. Specifically, one of the third cutting paths CP3 may include at least two different directions, such as the X direction and the Y direction. As shown in FIG. 7B, the third cutting paths CP3 may be used to cut the second die 120 of the second package 12a (or the first group G1), and a portion of the encapsulant 130 laterally surrounding the second die 120 is also removed. It should be noted that a corner 16 is formed at a connection of the two different directions of the third cutting paths CP3, as shown in FIG. 8. In the embodiment, the corner 16 has a curvature radius 15r in a range of 10 µm to 500 µm. It should be noted that the corner 16 may reduce the stress due to the coefficient of thermal expansion (CTE) mismatch between the first dies 110 and the encapsulant 130, thereby avoid the crack and/or delamination issue of the encapsulant 130. In other words, compared with the conventional mechanical sawing process, the laser cutting process is able to cut the package into various shapes of pieces, and round the corners of the package or die to decrease the stress, thereby improve the reliability and the yield of the package structure.

In some alternative embodiments, the laser cutting process further include performing cutting along a plurality of fourth cutting paths CP4 by using the laser 222. The fourth cutting paths CP4 may be not overlapped with the first, second, and third cutting paths CP1, CP2, and CP3. Specifically, one of the fourth cutting paths CP4 may include at least two different directions, such as the X direction and the Y direction. As shown in FIG. 7B, the fourth cutting paths CP4 may be used to cut the excess encapsulant 130 of the L-shaped package 12b (or the second group G2), wherein the excess encapsulant 130 has no die therein. The cut package 14 is shown in FIG. 8.

Referring to FIG. 8, after performing the second sawing process 220, the cut second package 14 including three first dies 110 is formed as a L-shaped package. The L-shaped package 14 may have a first cutting surface 214 corresponding to the first sawing process 210 and a second cutting surface 224 corresponding to the second sawing process 220. In detail, the second cutting surface 224 may include a first surface 51 extending along the X direction, a second surface S2 extending along the Y direction, and a curved surface S3 connecting the first surface 51 and the second surface S2. In some embodiments, the curved surface S3 has the curvature radius 16r in a range of 10 µm to 500 µm.

In addition, after performing the second sawing process 220, a recess 160 is formed by the second cutting surface 224, as shown in FIG. 8. That is, the recess 160 has a corner 16 with the curvature radius 15r in a range of 10 µm to 500 µm.

It should be noted that the first sawing process 210 is different from the second sawing process 220. Therefore, the first cutting surface 214 corresponding to the first sawing process 210 is different from the second cutting surface 224 corresponding to the second sawing process 220. The details are described in the following paragraphs.

FIG. 9A to FIG. 9E are cross-sectional views along a line I-I of FIG. 8 in accordance with various embodiments.

Figure 9B:
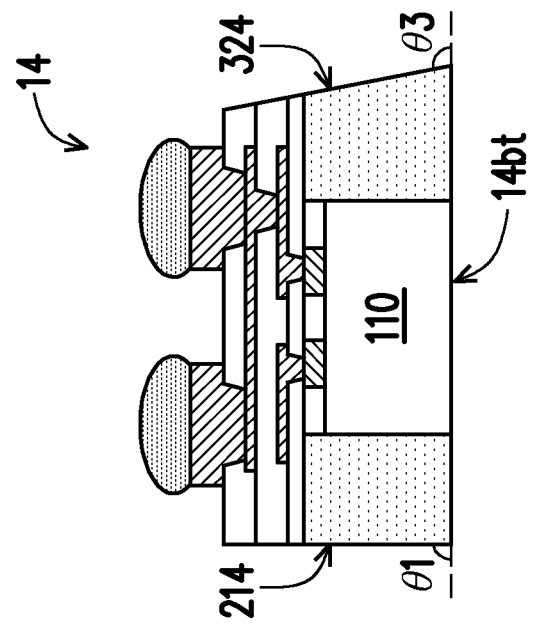
Figure 9A:
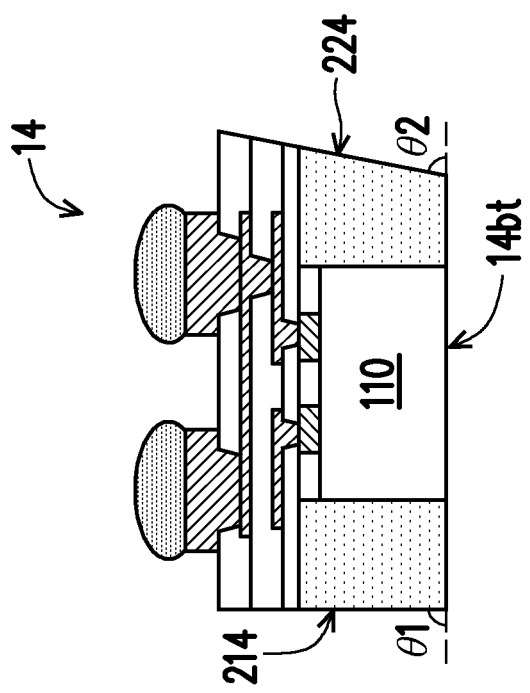

Referring to FIG. 9A, an angle $\theta 1$ between the first cutting surface 214 and a bottom surface 14bt of the cut second package 14 is closer to 90 degree than an angle $\theta 2$ between the second cutting surface 224 and the bottom surface 14bt of the cut second package 14. In some embodiments, the angle $\theta 1$ between the first cutting surface 214 and a bottom surface 14bt of the cut second package 14 is in a range of 83 degree to 97 degree, such as 90 degree. The angle $\theta 2$ between the second cutting surface 224 and the bottom surface 14bt of the cut second package 14 may be an acute angle or a non-right angle, and the angle $\theta 2$ may be in a range of 75 degree to 89 degree, such as 82 degree. It should be noted that the angle $\theta 2$ is tilt from 90 degree is caused by the focus of the laser 222 in the laser cutting process 220. In other words, the mechanical sawing process 210 may form a nearly perpendicular cutting surface 214, while the laser cutting process 220 may form a non-perpendicular cutting surface 224.

Referring to FIG. 9B, the angle $\theta 1$ between the first cutting surface 214 and the bottom surface 14bt of the cut second package 14 is closer to 90 degree than an angle $\theta 3$ between a second cutting surface 324 and the bottom surface 14bt of the cut second package 14. In some embodiments, the angle $\theta 3$ between the second cutting surface 324 and the bottom surface 14bt of the cut second package 14 may be an obtuse angle or a non-right angle, and the angle $\theta 3$ may be in a range of 91 degree to 106 degree, such as 98 degree.

Figure 9C:
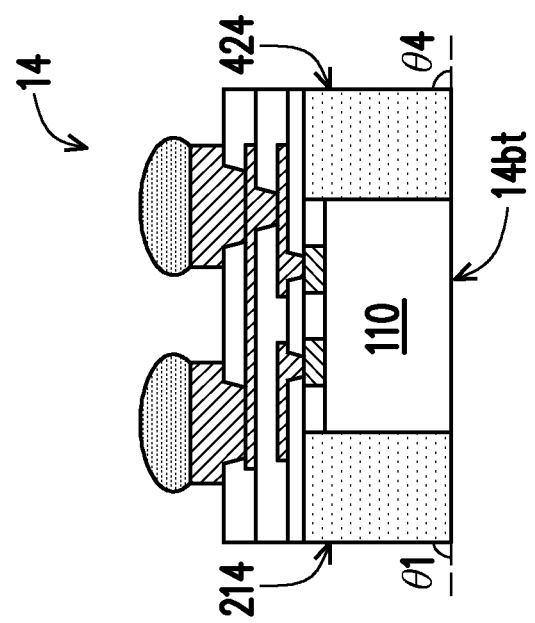

Referring to FIG. 9C, an angle $\theta 4$ between a second cutting surface 424 and the bottom surface 14bt of the cut second package 14 may be a right angle, and the angle $\theta 4$ may be in a range of 83 degree to 97 degree, such as 90 degree. In such embodiment, the first cutting surface 214 and the second cutting surface 424 are both perpendicular to the bottom surface 14bt of the cut second package 14. That is, the angle $\theta 4$ may be substantially equal to the angle $\theta 1$.

Referring to FIG. 9D, since a material of the encapsulant 130 is different from a material of the RDL structure 140, the amount of the removals of the encapsulant 130 and the RDL structure 140 by the same laser cutting (ablation) process are also different. In such embodiment, a second cutting surface 524 has a first sidewall 524a at a sidewall of the encapsulant 130 and a second sidewall 524b at a sidewall of the RDL structure 140. In some embodiments, the first sidewall 524a and the second sidewall 524b are staggered to each other. That is, the first sidewall 524a and the second sidewall 524b are not aligned to each other. Specifically, as shown in FIG. 9D, the first sidewall 524a may be recessed or concave from the second sidewall 524b when the amount of the removal of the encapsulant 130 is greater than the amount of the removal of the RDL structure 140. On the other hand, the second sidewall 524b may be recessed or concave from the first sidewall 524a when the amount of the removal of the RDL structure 140 is greater than the amount of the removal of the encapsulant 130.

In some embodiments, the angle $\theta 1$ between the first cutting surface 214 and the bottom surface 14bt of the cut second package 14 is closer to 90 degree than an angle $\theta 5$ between the first sidewall 524a and the bottom surface 14bt of the cut second package 14. In some embodiments, the angle $\theta 5$ between the first sidewall 524a and the bottom surface 14bt of the cut second package 14 may be an acute angle or a non-right angle, and the angle θ5 may be in a range of 75 degree to 89 degree, such as 82 degree. In addition, an angle θ6 is formed between the second sidewall 524b and an interface 135 between the encapsulant 130 and the RDL structure 140. In some embodiments, the angle θ6 between the second sidewall 524b and the interface 135 may be an acute angle or a non-right angle, and the angle θ6 may be in a range of 75 degree to 89 degree, such as 82 degree. In some embodiments, the angle θ6 is substantially equal to the angle θ5. In alternative embodiments, the angle θ6 is different from the angle θ5.

Referring to FIG. 9E, a second cutting surface 624 has a first sidewall 624a at a sidewall of the encapsulant 130 and a second sidewall 624b at a sidewall of the RDL structure 140. In some embodiments, the first sidewall 624a and the second sidewall 624b are staggered to each other. That is, the first sidewall 624a and the second sidewall 624b are not aligned to each other. Specifically, as shown in FIG. 9E, the first sidewall 624a may be recessed or concave from the second sidewall 624b when the amount of the removal of the encapsulant 130 is greater than the amount of the removal of the RDL structure 140. On the other hand, the second sidewall 624b may be recessed or concave from the first sidewall 624a when the amount of the removal of the RDL structure 140 is greater than the amount of the removal of the encapsulant 130.

In some embodiments, the angle θ1 between the first cutting surface 214 and the bottom surface 14bt of the cut second package 14 is closer to 90 degree than an angle θ7 between the first sidewall 624a and the bottom surface 14bt of the cut second package 14. In some embodiments, the angle θ7 between the first sidewall 624a and the bottom surface 14bt of the cut second package 14 may be an obtuse angle or a non-right angle, and the angle θ7 may be in a range of 91 degree to 106 degree, such as 98 degree. In addition, an angle θ8 is formed between the second sidewall 624b and the interface 135 between the encapsulant 130 and the RDL structure 140. In some embodiments, the angle θ8 between the second sidewall 624b and the interface 135 may be an obtuse angle or a non-right angle, and the angle θ8 may be in a range of 91 degree to 106 degree, such as 98 degree. In some embodiments, the angle θ8 is substantially equal to the angle θ7. In alternative embodiments, the angle θ8 is different from the angle θ7.

Figure 10:
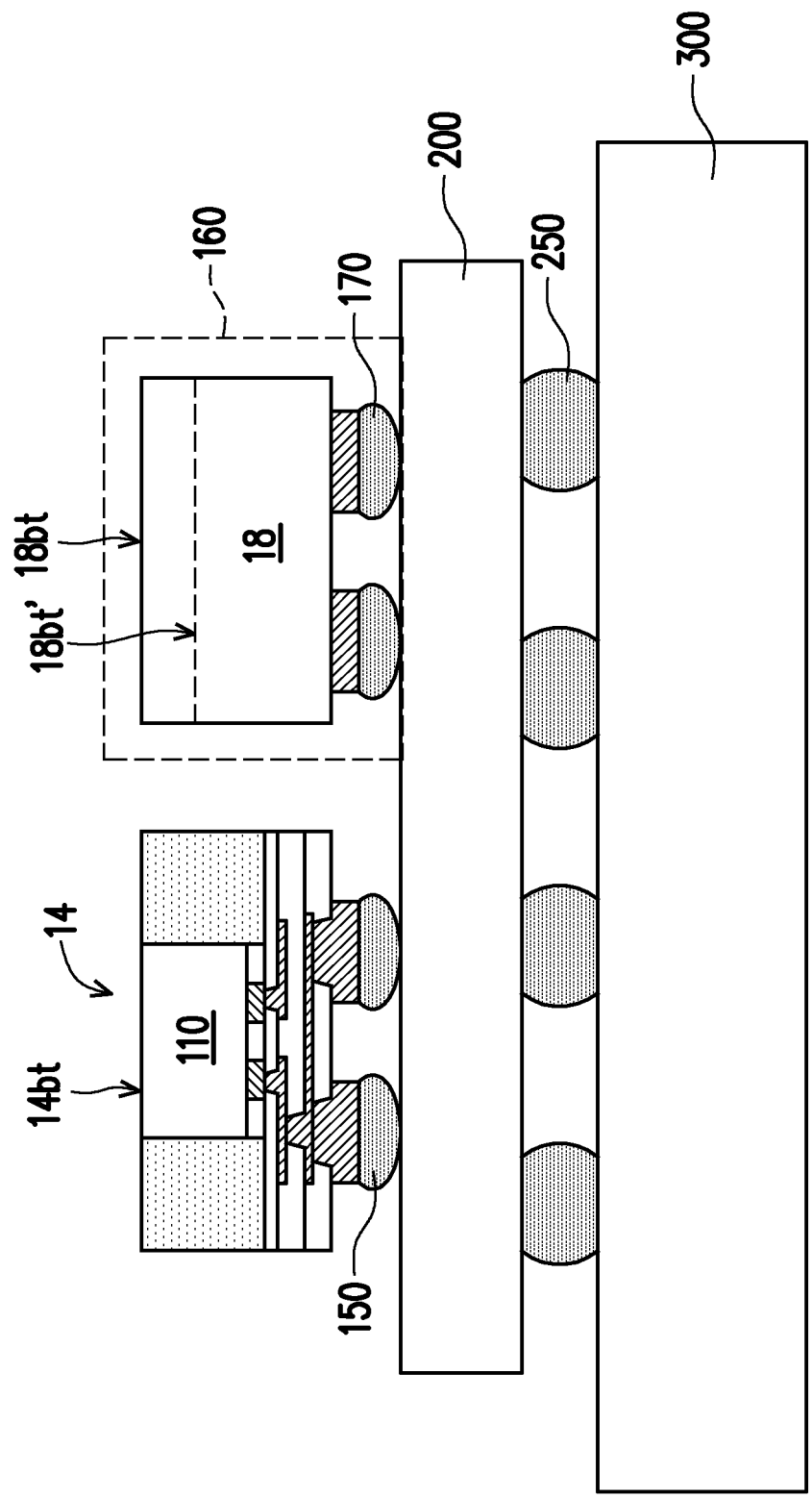
FIG. 10 is a cross-sectional view of a package structure in accordance with some embodiments.

FIG. 10 is a cross-sectional view of a package structure in accordance with some embodiments.

Referring to FIG. 10, the cut second package 14 illustrated in FIG. 8 is flipped and bonded onto a substrate 200 through the conductive terminals 150. The cut second package 14 shown in cross-sectional view of FIG. 10 is taken the structure of FIG. 9C as an example, the embodiments of the present disclosure are not limited thereto. In other embodiments, the structure illustrated in FIG. 9A to FIG. 9E can also be used to bonded onto the substrate 200.

In the embodiment, as shown in FIG. 8, since the cut second package 14 is formed as the L-shaped package, there is still space in the recess 160 to accommodate more integrated devices, thereby improving the flexibility of the device configuration and increasing the package usage area. In some alternative embodiments, the cut second package 14 may be formed as any shape package to meet the needs of the customization, thereby increasing the market competitiveness.

As shown in FIG. 10, an integrated device 18 is flipped and mounted onto the substrate 200 within the recess 160. That is, a bottom surface 18bt of the integrated device 18 is toward upward. The bottom surface 18bt of the integrated device 18 may be level with the bottom surface 14bt of the cut second package 14. Alternatively, the bottom surface 18bt' (as shown by the dotted line) of the integrated device 18 may be lower than the bottom surface 14bt of the cut second package 14. In some embodiments, the integrated device 18 is bonded onto the substrate 200 through a plurality of conductive terminals 170. The integrated device 18 may include a passive device, a memory device, or a combination thereof. The passive device may include an integrated passive device (IPD), a surface mount device (SMD), or the like, or a combination thereof. The memory device may include a dynamic random access memory (DRAM), a static random access memory (SRAM), or the like, or a combination thereof. Although only one integrated device 18 is illustrated in FIG. 10, the embodiments of the present disclosure are not limited thereto. In other embodiments, the number of the integrated device 18 can be adjusted by the needs.

In some embodiments, the substrate 200 may be referred to as an integrated circuit (IC) substrate that includes one or more active devices and/or one or more passive devices (not shown) therein. A wide variety of devices such as transistors, capacitors, resistors, combinations of these, and the like may be used to provide various structural and functional designs for the device stack. The devices may be formed using any suitable methods.

In some embodiments, the substrate 200 includes a substrate core (not shown). The substrate core may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core may be an SOI substrate. Generally, an SOI substrate includes a layer of a semiconductor material such as epitaxial silicon, germanium, silicon germanium, SOI, SGOI, or combinations thereof. The substrate core is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate 200 may also include metallization layers and vias (not shown) therein. The metallization layers may be formed over the active and passive devices in and/or on the substrate core, and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some alternative embodiments, the substrate core is substantially free of active and passive devices.

After mounting the cut second package 14 and the integrated device 18 onto the substrate 200. An overlying substrate 22 is bonded onto a circuit board 300 by a plurality of connectors 250, thereby accomplishing a package structure 1. In some embodiments, the circuit board 300 may be a printed circuit board (PCB), or other suitable circuit board to provide the function of the electrical connection. In some embodiments, the connectors 250 are made of a conductive material with low resistivity, such as Sn, Pb, Ag, Cu, Ni, Bi or an alloy thereof, and are formed by a suitable process such as evaporation, plating, ball drop, screen printing, or a ball mounting process. In the embodiments, the connectors 250 may be form a grid, such as a ball grid array (BGA). In some embodiments, the package structure 1 may be referred to as a chip-on-wafer-on substrate (CoWoS) package structure.

FIG. 11 is a top view of a package structure in accordance with some alternative embodiments.

Referring to FIG. 11, the cut package 24 is similar to the cut package 14 of FIG. 8. The main difference between the cut package 24 and the cut package 14 lies in that the first dies 110 of the cut package 24 have rounding corners 110c. In detail, before attaching the first dies 110 onto the carrier 100, the method optionally includes performing a trimming treatment on the first dies 110 to round corners 110c of the first dies 110. In such embodiment, the rounding corners 110c is able to decrease the stress instead of a right angle has higher stress concentration between the first dies 110 and the encapsulant 130, thereby avoid the crack and/or delamination issue of the encapsulant 130. As a result, the reliability and the yield of the package structure 2 are improved. In some embodiments, the trimming treatment may include using the same laser 222 of the said laser cutting process, as shown in FIG. 7A). The power and the processing time of the trimming treatment may be the same or different from those of the laser cutting process, and the embodiment of the disclosure is not limited.

In accordance with an embodiment, a method of forming a package structure includes: providing a first package having a plurality of first dies and a plurality of second dies therein; performing a first sawing process to cut the first package into a plurality of second packages, wherein one of the plurality of second packages comprises three first dies and one second die; and performing a second sawing process to remove the second die of the one of the plurality of second packages, so that a cut second package is formed into a polygonal structure with the number of nodes greater than or equal to 5.

In accordance with an embodiment, a method of forming a package structure, includes: providing a package having three first dies and one second die therein, wherein the three first dies and the second die are arranged in a 2×2 array; and performing a laser cutting process to remove the second die and form a recess, so that a cut package is formed into a polygonal structure with the number of internal angles greater than or equal to 5.

In accordance with an embodiment, a package structure includes a plurality of dies; an encapsulant encapsulating the plurality of dies; a redistribution layer (RDL) structure disposed on active surfaces of the plurality of dies and the encapsulant to form a L-shaped package, and a plurality of conductive terminals disposed on the RDL structure. The L-shaped package has a cutting surface, and the cutting surface comprises: a first surface extending along a X direction; a second surface extending along a Y direction; and a curved surface connecting the first and second surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, comprising:
providing a first package having a plurality of system on a chip (SoC) dies therein;
performing a mechanical sawing process to cut the first package into a plurality of second packages, wherein one of the plurality of second packages comprises three SoC dies and an encapsulant laterally encapsulating the three SoC dies; and
performing a laser cutting process to remove a portion of the encapsulant of the one of the plurality of second packages, so that a cut second package is formed into a L-shaped package.

2. The method of claim 1, wherein the portion of the encapsulant is free of any die.

3. The method of claim 1, wherein a dummy die is included in the portion of the encapsulant.

4. The method of claim 1, wherein the mechanical sawing process comprises performing cutting along a plurality of first cutting paths and a plurality of second cutting paths by using a blade.

5. The method of claim 4, wherein the laser cutting process comprises performing cutting along a plurality of third cutting paths by using a laser, and the plurality of third cutting paths are not overlapped with the plurality of first and second cutting paths.

6. The method of claim 1, further comprising forming a recess with a corner after performing the laser cutting process to remove the portion of the encapsulant of the one of the plurality of second packages, and the corner has a curvature radius of the corner is in a range of 10 μm to 500 μm.

7. The method of claim 6, further comprising:
mounting the cut second package on a substrate; and
mounting an integrated device on the substrate within the recess.

8. The method of claim 7, wherein the integrated device comprises a passive device, a memory device, or a combination thereof.

9. The method of claim 1, wherein the cut second package has a first cutting surface corresponding to the mechanical sawing process, the cut second package has a second cutting surface corresponding to the laser cutting process, and a first angle between the first cutting surface and a bottom surface of the cut second package is closer to 90 degree than a second angle between the second cutting surface and the bottom surface of the cut second package.

10. The method of claim 1, wherein before providing the first package, the method further comprises performing a trimming treatment on the plurality of SoC dies to round corners of the plurality of SoC dies.

11. A method of forming a package structure, comprising:
providing a rectangular package having three SoC dies and an encapsulant therein, wherein the three SoC dies are arranged in an L shape and laterally encapsulated by the encapsulant; and
performing a laser cutting process to remove a portion of the encapsulant without any SoC die therein and form a recess, so that a cut rectangular package is formed into a L-shaped package.

12. The method of claim 11, wherein the three first dies are functional dies, and the second die is a non-functional die.

13. The method of claim 12, wherein a corner is formed at a connection of the two different directions of the cutting path, and the corner has a curvature radius of the corner is in a range of 10 μm to 500 μm.

14. The method of claim 11, wherein the L-shaped package has a cutting surface, and a non-right angle is formed between the cutting surface and a bottom surface of the L-shaped package.

15. The method of claim 11, further comprising:
 mounting the L-shaped package on a substrate; and
 mounting an integrated device on the substrate within the recess.

16. The method of claim 15, wherein the integrated device comprises a passive device, a memory device, or a combination thereof.

\* \* \* \* \*